US012702030B2

(12) United States Patent
Kim et al.

(10) Patent No.: US 12,702,030 B2
(45) Date of Patent: Aug. 4, 2026

(54) POWER MODULE AND METHOD FOR MANUFACTURING SAME

(71) Applicants: Hyundai Motor Company, Seoul (KR); Kia Corporation, Seoul (KR)

(72) Inventors: Hyeon Uk Kim, Hwaseong (KR); Hyun Koo Lee, Seoul (KR); Jun Hee Park, Hwaseong (KR)

(73) Assignees: Hyundai Motor Company, Seoul (KR); Kia Corporation, Seoul (KR)

( * ) Notice: Subject to any disclaimer, the term of this patent is extended or adjusted under 35 U.S.C. 154(b) by 736 days.

(21) Appl. No.: 17/948,332

(22) Filed: Sep. 20, 2022

(65) Prior Publication Data

US 2023/0369195 A1      Nov. 16, 2023

(30) Foreign Application Priority Data

May 12, 2022     (KR) ........................ 10-2022-0058493

(51) Int. Cl.
H10W 70/65          (2026.01)
H10W 70/04          (2026.01)
(Continued)

(52) U.S. Cl.
CPC ....... H10W 70/658 (2026.01); H10W 70/041 (2026.01); H10W 70/047 (2026.01); (Continued)

(58) Field of Classification Search
CPC ......... H01L 23/49861; H01L 23/49537; H01L 23/49575; H01L 23/49531; (Continued)

(56) References Cited

U.S. PATENT DOCUMENTS

| | | | |
|---|---|---|---|
| 2004/0217479 A1* | 11/2004 | Katsura | ............... H01L 23/5225 |
| | | | 257/758 |
| 2008/0277765 A1* | 11/2008 | Lane | ....................... H01L 21/78 |
| | | | 257/E21.546 |
| 2014/0061821 A1* | 3/2014 | Kawano | ............ H01L 23/49551 |
| | | | 257/690 |

FOREIGN PATENT DOCUMENTS

| | | |
|---|---|---|
| KR | 10-1734712 B1 | 5/2017 |
| KR | 10-1836658 B1 | 3/2018 |

(Continued)

OTHER PUBLICATIONS

Office Action issued by KIPO on Nov. 16, 2025 in Korean Patent Application No. 10-2022-0058493.

*Primary Examiner* — Michele Fan
(74) *Attorney, Agent, or Firm* — Fox Rothschild LLP

(57) ABSTRACT

Disclosed are a power module and a method for manufacturing the same. A power module according to an embodiment of the present disclosure includes: a first substrate; a second substrate disposed spaced apart from the first substrate and including at least one metal layer; at least one chip disposed between the first substrate and the second substrate and in electrical contact with the metal layer; and a third substrate configured to be disposed spaced apart from the first substrate and the second substrate, electrically connect the chip and at least one external input terminal, include one or more conductive patterns each of which is connected to one of the at least one lead frame, and be formed in a multi-layer structure such that the one or more conductive patterns are not short-circuited to each other.

10 Claims, 7 Drawing Sheets

(51) Int. Cl.
    *H10W 70/40*       (2026.01)
    *H10W 90/00*       (2026.01)
    *H10W 72/00*        (2026.01)

(52) U.S. Cl.
    CPC ....... *H10W 70/479* (2026.01); *H10W 90/401*
        (2026.01); *H10W 90/701* (2026.01); *H10W*
        *72/865* (2026.01); *H10W 72/868* (2026.01);
        *H10W 72/884* (2026.01); *H10W 72/886*
        (2026.01); *H10W 90/734* (2026.01); *H10W*
        *90/755* (2026.01); *H10W 90/765* (2026.01)

(58) Field of Classification Search
    CPC .......... H01L 23/49838; H10W 70/479; H10W
        90/401; H10W 70/60; H10W 70/65
    See application file for complete search history.

(56)             References Cited

FOREIGN PATENT DOCUMENTS

| | | |
|---|---|---|
| KR | 20220014720 A | 2/2022 |
| KR | 20220026868 A | 3/2022 |

\* cited by examiner

[FIG. 1]
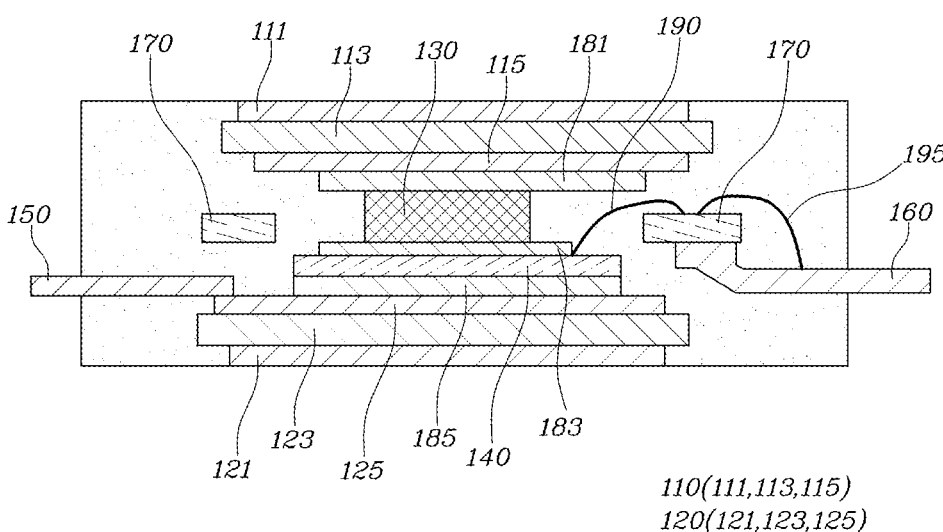
110(111,113,115)
120(121,123,125)

[FIG. 2]
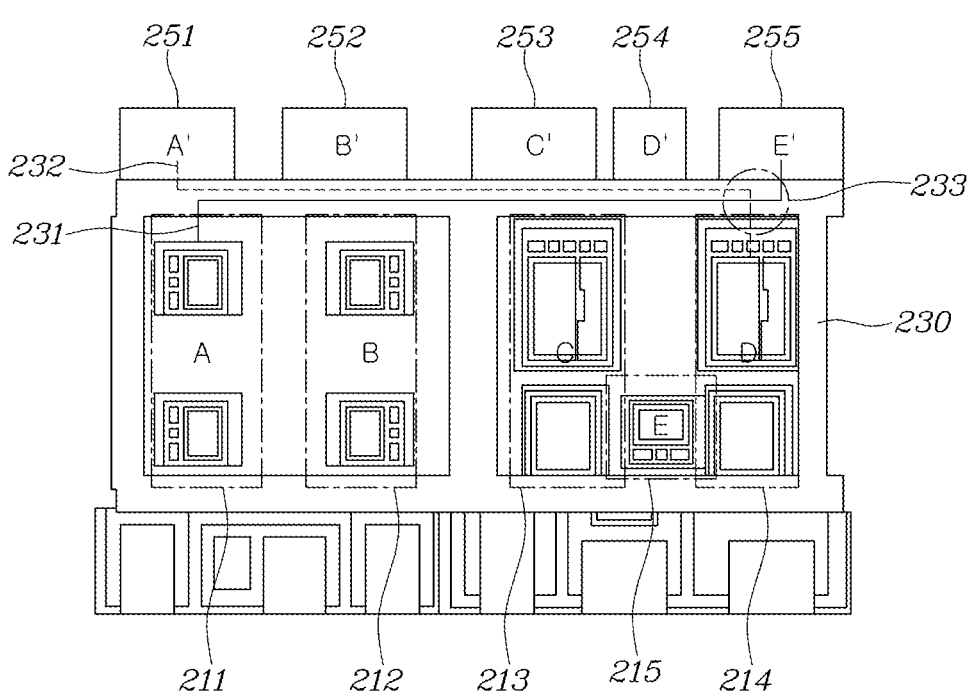

[FIG. 3]
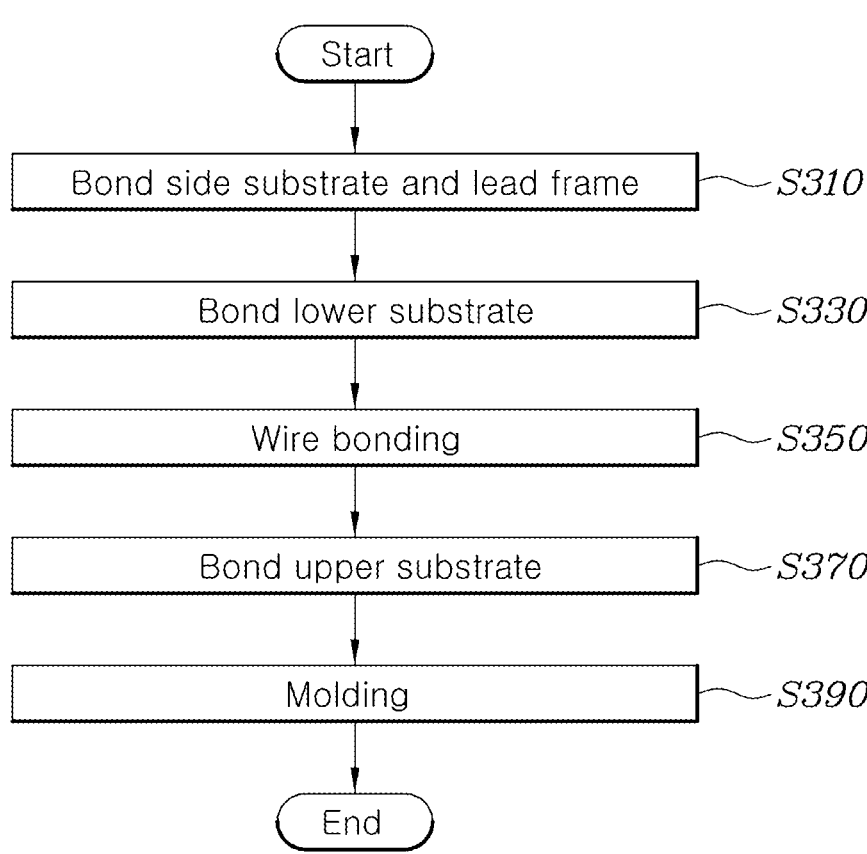

[FIG. 4]
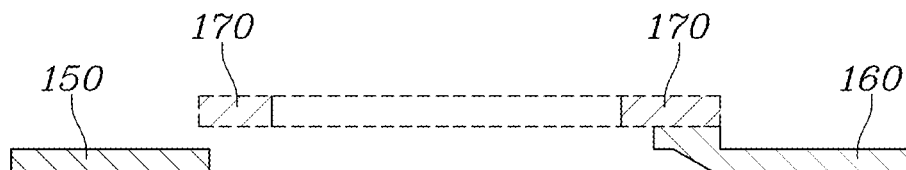

[FIG. 5]
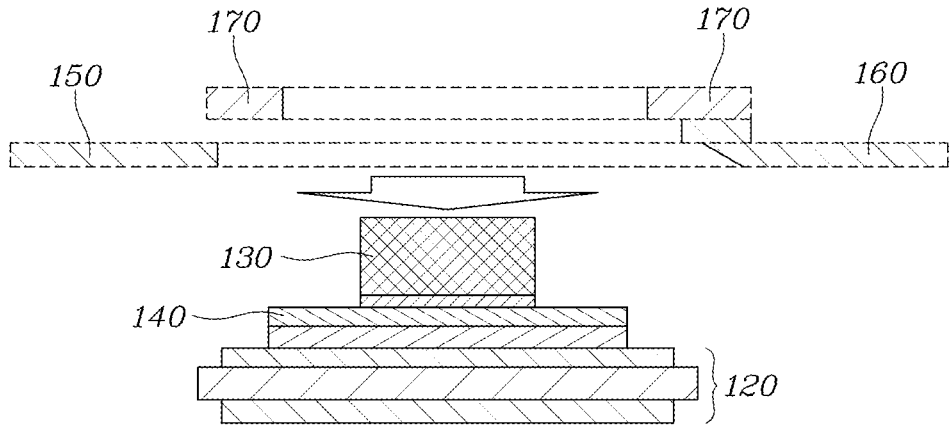

[FIG. 6]
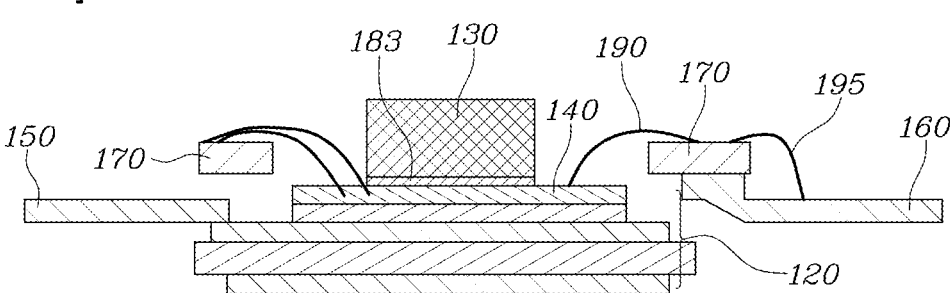

[FIG. 7]
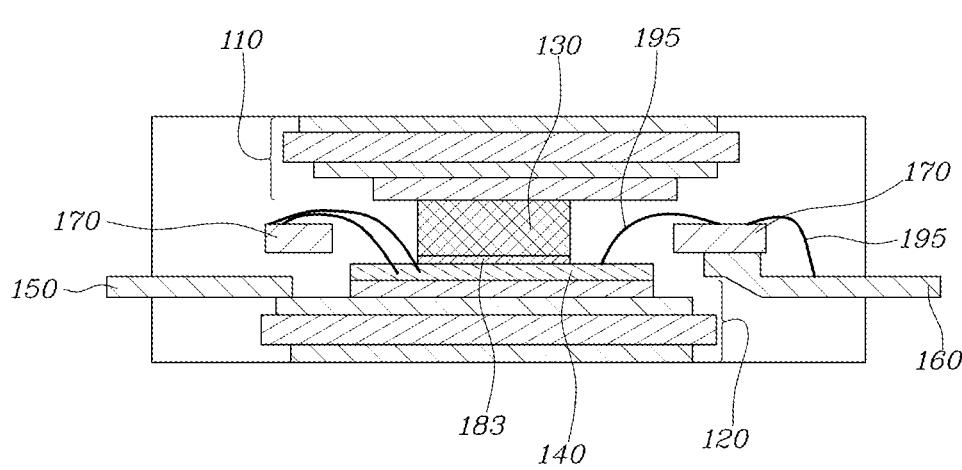

POWER MODULE AND METHOD FOR MANUFACTURING SAME

CROSS-REFERENCE TO RELATED APPLICATION(S)

This application is based on and claims priority under 35 U.S.C. § 119(a) to Korean Patent Application No. 10-2022-0058493, filed on Nay 12, 2022, in the Korean Intellectual Property Office, the disclosure of which is herein incorporated by reference in its entirety.

BACKGROUND

1. Field

The present disclosure relates to a power module and a method for manufacturing the same and, more particularly, to a power module which can be easily design-changed and expanded and a method for manufacturing the same.

2. Description of the Related Art

A power module is an essential component mounted on every electronic device, and not only supplies power, but also convert power, secures stability and efficiency, and plays various other roles.

Examples of such power modules include IBGT modules having an insulating gate-type bipolar transistor IGBT211 for power conversion and multiple diodes mounted inside a dedicated case, current sensor-embedded power management modules (IPM) having additional protective circuits against overcurrent, overheating, and the like, and MOSFET modules including a metal-oxide-silicon field-effect transistors MOSFET.

Meanwhile, some power modules such as double-side cooling-type power modules may have two substrates spaced apart while facing each other.

In this connection, according to Korean Registered Patent No. 10-1836658 (date of registration: Mar. 2, 2018), entitled "POWER MODULE AND METHOD FOR MANUFACTURING THE SAME", and Korean Registered Patent No. 10-1734712 (date of registration: May 2, 2017), entitled "POWER MODULE", two substrates (upper and lower substrates) are disposed one above the other at a distance from each other, and a semiconductor chip (CHIP) is installed between the upper and lower substrates and is electrically connected to a lead frame through wire bonding or the like, thereby maximizing cooling efficiency.

An electric short circuit may occur if the wire contacts the upper substrate. A spacer may thus be installed between the upper and lower substrates to secure a vertical distance from the upper substrate, thereby preventing the wire from contacting the upper substrate.

Such a power module commonly has a chip installed on the lower substrate and electrically connected to an adjacent lead frame through a wire, and the lead frame is directly connected to an adjacent terminal or electrically connected thereto through a wire.

However, a power module having the above-mentioned structure has a problem in that, in order to connect a chip and a distant terminal through design change, both the chip and the terminal need to be repositioned, making it necessary to redesign the power module as a whole.

Therefore, the pertinent technical field has a need for a power module which can be easily design-changed and expanded and a method for manufacturing the same.

SUMMARY OF THE DISCLOSURE

It is an aspect of the present disclosure to provide a power module which can be easily design-changed and expanded and a method for manufacturing the same.

In accordance with an aspect of the present disclosure, a power module according to an embodiment includes: a first substrate; a second substrate spaced apart from the first substrate and including at least one metal layer; at least one chip disposed between the first substrate and the second substrate and in electrical contact with the at least one metal layer; and a third substrate spaced apart from the first substrate and the second substrate, and electrically connecting the at least one chip and at least one external input terminal, the third substrate comprising one or more conductive patterns. In various embodiments, each conductive pattern of the one or more conductive patterns is connected to one lead frame of the at least one lead frame, and is formed in a multi-layer circuit structure such that the one or more conductive patterns are not short-circuited to each other.

The at least one lead frame may further include a first lead frame in electrical contact with the at least one metal layer, and the chip may receive power through the first lead frame and the at least one metal layer.

The lead frame may further include a second lead frame spaced apart from the first substrate and the second substrate, and the third substrate may be disposed on the second lead frame.

The second lead frame may be electrically connected to at least one external input terminal of a plurality of external input terminals such that the chip may receive an external input signal through the second lead frame and the third substrate.

The chip may be electrically connected to the third substrate through wire or metal clip bonding.

The third substrate may include a plurality of wire bonding holes, and the at least one chip may be bonded to one wire bonding hole of the plurality of wire bonding holes, and the plurality of wire bonding holes may be connected to the different external input terminals via the different second lead frames.

The third substrate may include a plurality of metal clip bonding parts, the chip may be bonded to one metal clip bonding part of the plurality of metal clip bonding parts, and each metal clip bonding part of the plurality metal clip bonding parts is connected to different external input terminals via different second lead frames.

The conductive patterns may be formed in a stereoscopic structure, such that even though crossing and passing on the same plane, the different conductive patterns may be spaced apart from each other in space.

Each of the conductive patterns may be configured on a different layer of the third substrate such that even though crossing and passing on the same plane, the different conductive patterns may be spaced apart from each other in space.

The power module may further include a spacer configured to allow the first substrate and the second substrate to be spaced a predetermined distance apart from each other.

The chip may be in electric contact with the spacer.

A contact agent may be applied between the chip and the spacer.

A contact agent may be applied between the chip and the metal layer.

A method for manufacturing a power module according to an embodiment of the present disclosure may include:

bonding a side substrate and at least one lead frame together; mounting at least one chip to a lower substrate; bonding the side substrate and the lower substrate together; and electrically connecting the side substrate and the at least one chip, and an operation of bonding the lower substrate and an upper substrate together.

The method for manufacturing a power module may further include filling a filling material between the upper substrate and the lower substrate.

In the electrically connecting the side substrate and the at least one chip, the at least one chip may be electrically connected to at least one electrode of a plurality of electrodes of the side substrate through wire bonding.

According to the present disclosure, a power module which can be easily design-changed and expanded is provided.

BRIEF DESCRIPTION OF THE DRAWINGS

FIG. 1 is a sectional view illustrating a power module according to an embodiment of the present disclosure;

FIG. 2 shows a package having a substrate to which the power module according to the embodiment of FIG. 1 is applied;

FIG. 3 is a flowchart illustrating a method for manufacturing a power module according to an embodiment of the present disclosure;

FIG. 4 is a sectional view of a process of a method for manufacturing a power module according to an embodiment of the present disclosure;

FIG. 5 is a sectional view of a process of a method for manufacturing a power module according to an embodiment of the present disclosure;

FIG. 6 is a sectional view of a process of a method for manufacturing a power module according to an embodiment of the present disclosure; and FIG. 7 is a sectional view of a process of a method for manufacturing a power module according to an embodiment of the present disclosure.

DETAILED DESCRIPTION OF THE EXEMPLARY EMBODIMENTS

Hereinafter, embodiments set forth herein will be described in detail with reference to the accompanying drawings. Regardless of drawing numbers, similar or like reference signs are provided to similar or like elements, and repeated descriptions thereof will be omitted.

In describing the embodiments set forth herein, a detailed description of known functions or configurations incorporated herein will be omitted when it is determined that the description may make the subject matter of the disclosure unnecessarily unclear. In addition, it should be appreciated that the accompanying drawings are only for the sake of easy understanding of the embodiments set forth herein, and the technical idea of the present disclosure is not limited to the accompanying drawings and includes all modifications, equivalents, and alternatives falling within the spirit and scope of the present disclosure.

Such terms as "a first" and/or "a second" may be used to describe various elements, but the elements are not limited by these terms. These terms are intended merely to distinguish one element from other elements.

In the case where an element is referred to as being "connected" or "accessed" to other elements, it should be understood that not only the element is directly connected or accessed to the other elements, but also another element may exist between them. Contrarily, in the case where a component is referred to as being "directly connected" or "directly accessed" to any other component, it should be understood that there is no component therebetween.

A singular expression may include a plural expression unless they are definitely different in a context.

As used herein, the expression "include" or "have" are intended to specify the existence of mentioned features, numbers, steps, operations, elements, components, or combinations thereof, and should be construed as not precluding the possible existence or addition of one or more other features, numbers, steps, operations, elements, components, or combinations thereof.

In a conventional power module, two substrates including an upper substrate and a lower substrate spaced apart from each other are disposed in upward/downward directions, a semiconductor chip is installed between the upper substrate and the lower substrate, and the chip is electrically connected to a circuit (that is, a metal pattern) on the upper substrate or the lower substrate through a wire bonding or the like. In such a structure of a substrate and a chip, a metal pattern is formed on the upper substrate or the lower substrate which does not need heat dissipation performance, which raises the cost. In addition, a copper etching pattern method is mainly used to form a metal pattern on a substrate and needs an interval of 2 mm for each circuit line width so as to be a limitation factor for increasing a size of a product. Furthermore, since the metal pattern is formed on a plane of the upper substrate or the lower substrate, and thus a crossing design of the metal pattern is impossible, depending on a location of the chip and an external connection terminal, it needs to be designed so that the pattern is connected to the external connection terminal through a long path on the substrate. Furthermore, when a concept and a pin map of a power module is changed, it needs to be designed and manufactured a substrate again from the beginning by applying the design rule so as to cause inconvenience.

Hereinafter, a preferred embodiment of a power module according to the present disclosure for solving the above problems will be described in detail with reference to accompanying drawings.

FIG. 1 is a sectional view illustrating a power module according to an embodiment of the present disclosure.

Referring to FIG. 1, the power module 100 according to an embodiment includes an upper substrate 110, a lower substrate 120, a spacer 130, a chip 140, first and second lead frames 150, 160, a side substrate 170, first to third adhesive layers 181, 183, 185, and first and second wires 190, 195. The substrate 110 on the upper side is defined as the upper substrate, the substrate 120 on the lower side as the lower substrate, and the substrate 170 between or on a periphery of the substrates as the side substrate in the embodiment. However, the substrates may be defined as a first substrate, a second substrate, and a third substrate, respectively, or defined as other terms.

The upper substrate 110 includes a first metal layer 111, a first insulation layer 113, and a second metal layer 115, and the first metal layer 111, the first insulation layer 113, and a second metal layer 115 may be formed in a sequentially stacked structure. Here, the first metal layer 111 may be disposed at the outermost side of the power module to have a structure in which a surface of the first metal layer 111 is exposed outside.

The first metal layer 111 and the second metal layer 115 may be formed of a metal having electric conductivity and may be formed of a metal having electric conductivity, for example, copper.

The first insulation layer 113 may be formed of an insulative material and formed of, for example, a ceramic material.

The lower substrate 120 may be disposed spaced a predetermined distance apart with respect to the upper substrate 110 and includes a third metal layer 121, a second insulation layer 123, and a fourth metal layer 125.

In addition, the third metal layer 121, the second insulation layer 123, and the fourth metal layer 125 may form in a sequentially stacked structure.

Here, the third metal layer 121 may be disposed farthest away from the upper substrate 110 to have a structure in which a surface of the third metal layer 121 is exposed outside.

The third metal layer 121 and the fourth metal layer 125 may be formed of a metal having electric conductivity and may be formed of, for example, copper.

The second insulation layer 123 may be formed of an insulative material and formed of, for example, a ceramic material.

The fourth metal layer 125 and the first lead frame 150 are in physical contact with each other to be electrically connected and may feed required power to the chip 140.

The chip 140 may be disposed between the upper substrate 110 and the lower substrate 120 and may receive power and an input signal from the outside to generate an output signal. FIG. 1 show that the power module includes one chip 140, but one power module may include multiple chips 140 identical to each other or different from each other.

The spacer 130 may be disposed between the upper substrate 110 and the lower substrate 120 and allow the upper substrate 110 and the lower substrate 120 to be spaced a predetermined distance from each other.

The first adhesive layer 181 electrically connects the spacer 130 to the second metal layer 115 of the upper substrate 110.

The second adhesive layer 183 electrically connects the spacer 130 to the chip 140.

The third adhesive layer 185 electrically connects the chip 140 to the fourth metal layer 125 of the lower substrate 120.

Here, the first layer to the third layer 185 may be formed of a metal such as tin (Sn) and silver (Ag) having electric conductivity.

The first lead frame 150 receives power required to drive the chip 140 from the outside to supply the power to the chip 140.

Here, the first lead frame 150 is in physical contact with the fourth metal layer 125 to be capable of supplying power to the chip 140 through the fourth metal layer 125.

The second lead frame 160 transmits an input signal from an external input terminal to the chip 140.

Here, the input signal is transmitted to the chip 140 via the second lead frame 160 and the side substrate 170.

The side substrate 170 electrically connects the chip 140 and the second lead frame 160 to transmit an input signal from an external input terminal to the chip 140.

Here, the side substrate 170 is electrically connected to the second lead frame 160 through the second wire 195.

Here, the side substrate 170 may be formed of a printed circuit board (PCB) in which a circuit is implemented on a substrate.

Here, the PCB may be a PCB a having multilayer circuit structure.

Here, each conductive pattern forming the multilayer circuit structure may be connected different second lead frames 160 and connected to different external input terminals to transmit different external input signals to different chips 140.

Meanwhile, although not shown in FIG. 1, the side substrate 170 may include multiple wire bonding holes and each of bonding holes may be connected to different external input terminals via different second lead frames 160. That is, the chips 140 may be bonded to one of multiple bonding hole of the side substrate 170 through the first wire 190 and connected to different external input terminals therethrough.

Although it is shown that the side substrate 170 is connected to the chip 140 by wire bonding in FIG. 1, the side substrate 170 and the chip 140 may be electrically connected to each other through metal clip bonging.

Here, the side substrate 170 may include multiple metal clip bonding parts and each of metal clip bonding parts may be connected to different external input terminals via different second lead frames 160. That is, the chips 140 may be bonded to one of multiple metal clip bonding parts of the side substrate 170 through metal clip bonding and connected to different external input terminals therethrough.

Conventionally, in order to change a design of connecting the chip 140 to an external input terminal other than a previously connected external input terminal, the entire substrate needs to be redesigned and manufactured again. However, in the structure of multiple wire bonding holes or multiple metal clip bonding parts, a design of a power module may be simple changed by connecting a metal clip to another metal clip bonding part instead of the previously connected metal clip bonding part.

Here, multiple conductive patterns on the side substrate 170 may be formed to have a stereoscopic structure.

Each of multiple conductive patterns on the side substrate 170 may be configured in different layers.

Due to the stereoscopic structure or the configuration of different layers, even if different conductive patterns cross and pass with respect to the same plane, the conductive patterns are spaced apart from each other in space, so that the conductive patterns are not be short-circuited.

The first wire 190 electrically connects the chip 140 and the side substrate 170, and the second wire 195 electrically connects the side substrate 170 and the second lead frame 160.

Meanwhile, in the power module having the structure in FIG. 1, a connection path between the chip and the external input terminal is implemented in the side substrate 170 and thus a power module package may be implemented reduced in size and the cost may be reduced.

In addition, circuits in the side substrate 170 may be implemented in multiple layers and thus it is possible to design crossing circuits.

Furthermore, when a position or a direction of a chip on a substrate is changed, it is possible to simply change the design by releasing wire connection between the chip 140 and an electrode on the side substrate 170 and newly connecting the chip to another electrode.

FIG. 2 shows a package having a substrate to which the power module according to the embodiment of FIG. 1 is applied.

Referring to FIG. 2, the power module package according to the embodiment includes multiple chips 211, 212, 213, 214, 215, a side substrate 230, and multiple terminals 251, 252, 253, 254, 255.

The multiple chips 211, 212, 213, 214, 215 in the power module package in the embodiment may correspond to the chip 140 in the embodiment of FIG. 1, the side substrate 230 to the side substrate 170, and multiple terminals 251, 252, 253, 254, 255 to the external terminal connected to the second lead frame 160.

The multiple chips include first to fifth groups 211, 212, 213, 214, 215, and the multiple terminals include first to fifth terminals 251, 252, 253, 254, 255.

Here, all the first to fifth groups 211, 212, 213, 214, 215 are connected to the first to fifth terminals 251, 252, 253, 254, 255 via the side substrate 230, and all circuits for connecting each of the first to fifth groups 211, 212, 213, 214, 215 to the first to fifth terminals 251, 252, 253, 254, 255 is configured inside the side substrate 230.

In a conventional technique, when chips of the first group 211 are connected to the fifth terminal 255 by using a first pattern 231, and chips of the fourth group 214 are connected to the first terminal 251 by using a second pattern 232, it is impossible to design metal patterns to cross and thus the first pattern 231 or the second pattern 232 needs to be designed to connect each chip to each terminal through a distant path on a substrate. However, referring to FIG. 2, the first pattern 231 and the second pattern 232 may seem to cross each other at a crossing point 233 but do not short-circuit each other because the patterns pass through the crossing point 233 while being spaced apart from each other at different heights on a multi-layered substrate. In addition, when there needs a design change to change configuration of a circuit so as to connect each chip to different terminals, it is possible to change the circuit simply by connecting a wire or a metal clip connected between the chips and the side substrate 230 to different wire bonding holes or metal clip bonding parts without reconfiguring the entire circuit configuration. For example, first to fifth wire holes (not shown) are provided on the side substrate 230, and may provide connection with the first to fifth terminals 251, 252, 253, 254, 255, respectively.

FIG. 3 is a flowchart illustrating a method for manufacturing a power module according to an embodiment of the present disclosure. According to the method for manufacturing a power module according to an embodiment of FIG. 3, the power module in the embodiment of FIG. 1 may be manufactured.

Referring to FIG. 3, the method for manufacturing a power module according to an embodiment of the present disclosure includes an operation (S310) of bonding the side substrate 170 and the lead frames 150, 160.

Here, the first lead frame 150 and the second lead frame 160 may be simultaneously bonded to the side substrate 170 or sequentially bonded regardless of the order.

Here, the side substrate 170 and the lead frames 150, 160 are only physically connected and may be bonded to be electrically insulated.

Furthermore, the method for manufacturing a power module according to an embodiment of the present disclosure further includes an operation (S330) of bonding the side substrate 170 to the lower substrate 120.

The lower substrate 120 may be a lower substrate 120 to which the chip 140 and the spacer 130 are mounted.

Although not shown in the drawing, the method for manufacturing a power module according to an embodiment of the present disclosure may further include, before operation S330, an operation of mounting the chip 140 on the lower substrate 120 and an operation of mounting the spacer 130 on the lower substrate on which the chip 140 have been mounted. Here, an adhesive 117, 180 may be applied between the lower substrate 120 and the chip 140 or the chip 140 and the spacer 130.

Here, an electrically conductive material, for example, tin (Sn), may be used for the adhesive 117, 180.

Here, the boding between the side substrate 170 and the lower substrate 120 may be performed by using a soldering method.

Furthermore, the method for manufacturing a power module according to an embodiment of the present disclosure further includes an operation (S350) of connecting at least two of the chip 140, the side substrate 170, and the lead frame 150, 160 on the side substrate with a wire.

Furthermore, the method for manufacturing a power module according to an embodiment of the present disclosure further includes an operation (S370) of bonding the upper substrate and the lower substrate.

Here, the boding between the lower substrate 120 and the upper substrate 110 may be performed by using a soldering method.

Furthermore, the method for manufacturing a power module according to an embodiment of the present disclosure further includes an operation (S390) of forming the substrates have been bonded to each other in operation S370 by molding.

FIG. 4 to FIG. 7 are sectional views of a process of the method for manufacturing a power module according to the embodiment of FIG. 3.

Referring to FIG. 4, an operation (S310) of bonding the side substrate and the lead frames is performed.

Here, the first lead frame 150 and the second lead frame 160 may be simultaneously bonded to the side substrate 170 or sequentially bonded regardless of the order.

Here, the side substrate 170 and the lead frames 150, 160 are only physically connected and may be bonded to be electrically insulated.

Referring to FIG. 5, an operation (S330) of bonding the side substrate 170 and the lower substrate 120 is performed.

The lower substrate 120 may be a lower substrate 120 to which the chip 140 and the spacer 130 are mounted.

Although not shown in the drawing, an operation of mounting the chip 140 on the lower substrate 120 and an operation of mounting the spacer 130 on the lower substrate on which the chip 140 have been mounted may be performed before operation S330. Here, an adhesive 117, 180 may be applied between the lower substrate 120 and the chip 140 or the chip 140 and the spacer 130.

Here, an electrically conductive material, for example, tin (Sn) may be used for the adhesive 117, 180.

Here, the boding between the side substrate 170 and the lower substrate 120 may be performed by using a soldering method.

Referring to FIG. 6, an operation (S350) of connecting at least two of the chip 140 on the lower substrate, the side substrate 170, and the first and second lead frames 150, 160 by the first and second wires 190, 195 is performed.

Here, the chip 140 on the lower substrate and the side substrate 170 may be electrically connected by the first wire 190.

Here, the side substrate 170 and the second lead frame 160 may be electrically connected by the second wire 195.

Referring to FIG. 7, an operation (S370) of bonding the lower substrate and the upper substrate and an operation (S390) of forming the bonded substrates by molding are performed.

Here, the boding between the lower substrate 120 and the upper substrate 110 may be performed by using a soldering method.

The power module and the method for manufacturing same according to the present disclosure are not limited to the configurations and methods of the above-described embodiments, but some or all the embodiments may be configured to be selectively combined such that the embodiments can be modified in various manners.

What is claimed is:

1. A power module comprising:

a first substrate;

a second substrate spaced apart from the first substrate and comprising at least one metal layer;

at least one chip disposed between the first substrate and the second substrate and in electrical contact with the at least one metal layer; and a third substrate spaced apart from the first substrate and the second substrate, and electrically connecting the at least one chip and at least one lead frame, the third substrate comprising one or more conductive patterns, wherein each of the conductive patterns is connected to one lead frame of the at least one lead frame, and is formed in a multi-layer circuit structure such that the one or more conductive patterns are not short-circuited to each other, wherein each of the conductive patterns is disposed on a different layer of the third substrate such that even though crossing and passing on the same plane, the different conductive patterns are spaced apart from each other in space so as to prevent short-circuiting between the conductive patterns, wherein the at least one lead frame comprises a first lead frame in electrical contact with the at least one metal layer, wherein the chip receives power through the first lead frame and the at least one metal layer, wherein the at least one lead frame comprises a second lead frame spaced apart from the first substrate and the second substrate, and wherein the third substrate is disposed on the second lead frame.

2. The power module of claim 1, wherein the second lead frame is electrically connected to at least one external input terminal of a plurality of external input terminals such that the chip receives an external input signal through the second lead frame and the third substrate.

3. The power module of claim 2, wherein the chip is electrically connected to the third substrate through wire or metal clip bonding.

4. The power module of claim 3, wherein the third substrate comprises a plurality of wire bonding holes, and the at least one chip is bonded to one wire bonding hole of the plurality of wire bonding holes, and wherein the plurality of wire bonding holes are connected to the different external input terminals via the different second lead frames.

5. The power module of claim 3, wherein the third substrate comprises a plurality of metal clip bonding parts, wherein the chip is bonded to one metal clip bonding part of the plurality of metal clip bonding parts, and wherein each metal clip bonding part of the plurality of metal clip bonding parts is connected to different external input terminals via different second lead frames.

6. The power module of claim 1, wherein the conductive patterns are formed in a stereoscopic structure, such that even though crossing and passing on the same plane, the different conductive patterns are spaced apart from each other in space.

7. The power module of claim 1, further comprising:

a spacer configured to allow the first substrate and the second substrate to be spaced a predetermined distance apart from each other.

8. The power module of claim 1, wherein the chip is in electric contact with the spacer.

9. The power module of claim 8, wherein a contact agent is applied between the chip and the spacer.

10. The power module of claim 1, wherein a contact agent is applied between the chip and the metal layer.

* * * * *